(12) United States Patent
Shintani et al.

(10) Patent No.: US 8,302,134 B2
(45) Date of Patent: Oct. 30, 2012

(54) SYSTEMS AND METHODS FOR TELEVISION ANTENNA OPERATION

(75) Inventors: Peter Rae Shintani, San Diego, CA (US); Robert Noel Blanchard, Escondido, CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 2946 days.

(21) Appl. No.: 10/811,036

(22) Filed: Mar. 26, 2004

(65) Prior Publication Data

US 2005/0216937 A1 Sep. 29, 2005

(51) Int. Cl.
 *H04N 7/18* (2006.01)
(52) U.S. Cl. .......................... 725/72; 348/731
(58) Field of Classification Search .............. 725/72; 348/731

See application file for complete search history.

(56) References Cited

U.S. PATENT DOCUMENTS

| | | | |
|---|---|---|---|
| 4,352,202 A | 9/1982 | Carney | |
| 5,214,364 A | 5/1993 | Perdue et al. | |
| 5,471,219 A | 11/1995 | Rodeffer et al. | |
| 5,771,015 A | 6/1998 | Kirtman et al. | |
| 5,812,066 A | 9/1998 | Terk et al. | |
| 5,896,183 A | 4/1999 | Terk et al. | |
| 6,075,330 A | 6/2000 | Terk | |
| 6,128,466 A * | 10/2000 | Terk et al. | 725/149 |
| 6,239,744 B1 | 5/2001 | Singer et al. | |
| 6,441,843 B1 | 8/2002 | Limberg | |
| 6,476,778 B1 | 11/2002 | Hussaini et al. | |
| 6,665,020 B1 | 12/2003 | Stahl et al. | |
| 7,034,893 B2 * | 4/2006 | Liu et al. | 348/614 |
| 2002/0083458 A1 | 6/2002 | Henderson et al. | |

* cited by examiner

*Primary Examiner* — Hunter B Lonsberry
(74) *Attorney, Agent, or Firm* — Haverstock & Owens LLP

(57) ABSTRACT

A system and method for controlling a television antenna includes an amplifier circuit mounted with the television antenna. The amplifier circuit is connected to the television antenna and a control line. The control line is used for controlling the gain of the amplifier circuit.

7 Claims, 9 Drawing Sheets

SYSTEMS AND METHODS FOR TELEVISION ANTENNA OPERATION

BACKGROUND

In some areas, the predominant method of delivering a television signal is by terrestrial broadcast. The broadcast signal is then received by viewers using an antenna connected to a television set. This broadcast signal will be strong near the transmitter and then get weaker with distance. The broadcast signal will also get weaker due to physical obstructions that occur between the transmitter and the viewer's antenna. In areas where the broadcast signal is weak or subject to strong multi-path signals, the antenna may be mounted on a rooftop or other exterior location for improved reception. A wire or cable then transmits the signal received by the antenna indoors to the television set.

For optimal operation, the exterior antenna should generally be at least a particular minimum size. However, for aesthetic reasons, homeowners and other building owners may opt for a smaller, less obvious exterior television antenna. Unfortunately, as the exterior antenna is made smaller, reception quality is sacrificed. In particular, if the antenna is smaller than the optimal size, the result may be reduced gain, poorer front to back rejection, more side lobes, poor impedance matching, etc.

However, antenna designers and manufacturers can often trade on one more of these parameters, while still maintaining sufficient performance in the remaining parameters. For example, gain can be sacrificed while still maintaining generally good reception, even with a shorter antenna boom length.

SUMMARY

A system and method for controlling an exterior television antenna includes an amplifier circuit mounted on a building exterior with the exterior television antenna and connected to the television antenna and a control line extending into an interior of the building. The control line is connected to the amplifier circuit for controlling the gain of the amplifier circuit.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

Throughout the drawings, identical reference numbers designate similar, but not necessarily identical, elements.

DETAILED DESCRIPTION

As described above, antenna designers and manufacturers may choose to sacrifice gain, bandwidth, directivity, and front-to-back ratio to provide a smaller, more aesthetic, but still functional antenna. If gain is sacrificed to provide a smaller antenna, the loss in gain can be compensated for by using an amplifier to amplify the signal output by the antenna.

In order to minimize the noise in the overall system, the amplifier is preferably mounted as close to the antenna as possible, for example, on the building exterior with the antenna, on the antenna mast or directly to the antenna. The amplifier may also be integrated into the antenna.

Such an amplifier is preferably relatively sensitive, has a low noise figure and has a broad dynamic range. Unfortunately, such an amplifier is also expensive to produce.

Moreover, not all the television signals received are of equal strength. Both strong and weak signals will be present. A sensitive amplifier may be needed for the reception of weaker signals. However, a sensitive amplifier may be overloaded by the presence of strong television or other signals.

Accordingly, the present specification describes a method and system of controlling and powering an amplifier mounted with an exterior television antenna that compensates for the strength of the television signal to be received and amplified. The methods and systems described can also be used to adjust the polarity and direction of the antenna to optimize signal reception.

Figure 1:
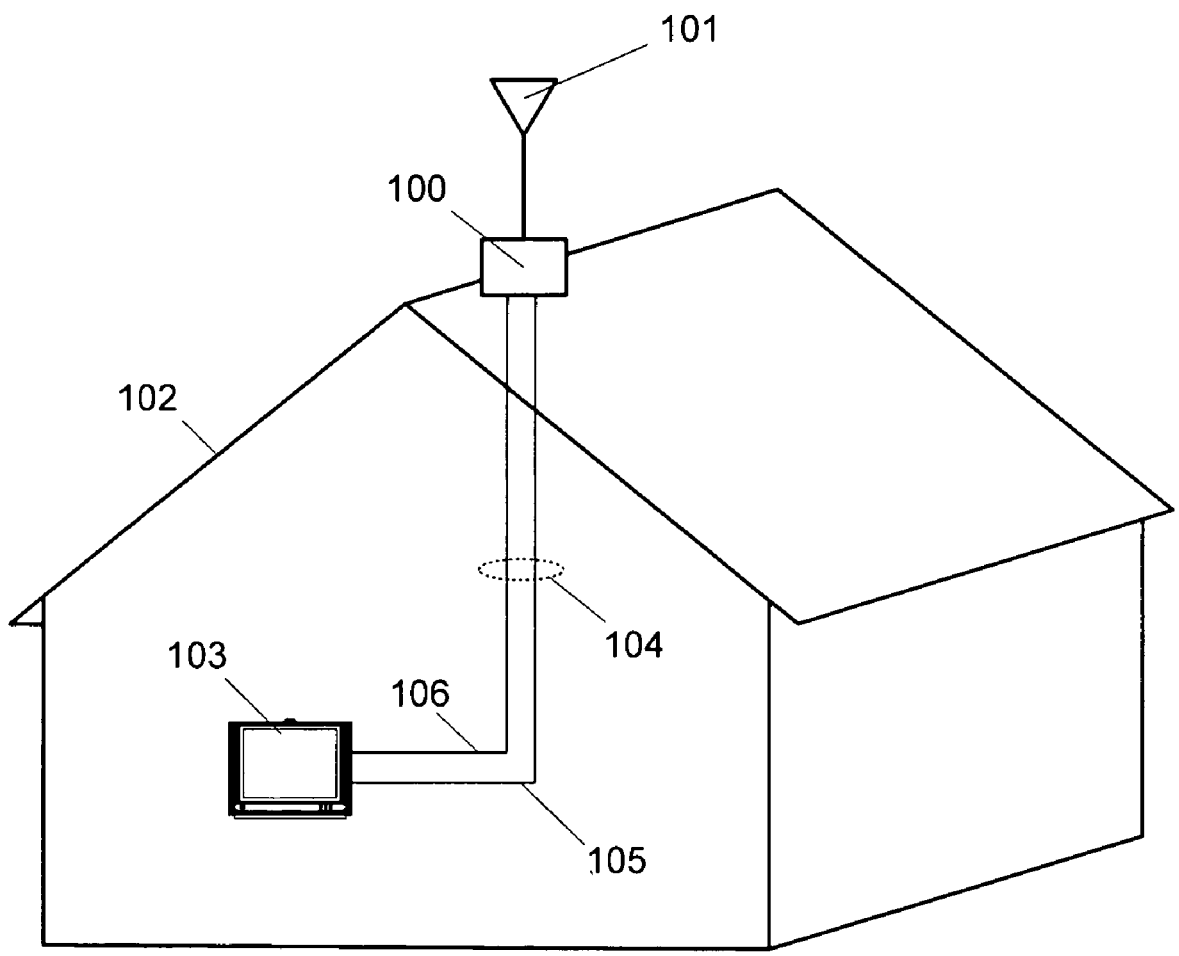
FIG. 1 illustrates an exterior antenna and amplifier system according to one embodiment of the principles described herein.

FIG. 1 illustrates an exterior antenna and amplifier system according to one embodiment of the principles disclosed herein. As shown in FIG. 1, a television antenna (101) is mounted on the exterior, e.g., the rooftop, of a building (102). The building (102) may be any building, for example, a single-family home, a duplex, an apartment building, a commercial building, etc. The antenna (101) is placed on the exterior of the building (102) to improve reception of the television signal. This will particularly be the case where the broadcast television signal is relatively weak.

An amplifier circuit (100) is mounted with the exterior antenna (101), for example, on the antenna mast. A wire or cable (105) transmits the television signal received by the antenna (101) into the interior of the building (102) to a television set (103) or other receiving device. For example, the cable (105) could also deliver the television signal to a video cassette recorder, set-top box, personal video recorder or the like.

The amplifier circuit (100) amplifies the signal received and output by the antenna (101). This compensates for a loss of gain in the antenna (101) resulting from a decrease in the size of the antenna for aesthetic or other reasons.

The amplifier circuit (100) is controlled depending on the television channel that the television (103) is tuned to receive. Depending on whether the signal for that channel is relatively strong or relatively weak, the gain of the amplifier circuit (100) is controlled accordingly.

Consequently, the television (103) has a control line (106) connected to the amplifier circuit (100) over which a control signal can be sent to control the amplifier circuit (100). This control line (106) may also be used to provide power for the amplifier circuit (100). In fact, in one embodiment, the power needed by the amplifier circuit (100) is also used as the control signal to control the gain of the amplifier circuit (100).

As shown in FIG. 1, the signal cable (105) providing the signal from the antenna (101) and the control line (106) controlling the amplifier circuit (100) may be packaged or sheathed together to form a signal cable (104) between the television (103) and the antenna (101). This will simplify the wiring of the system illustrated.

Figure 2:
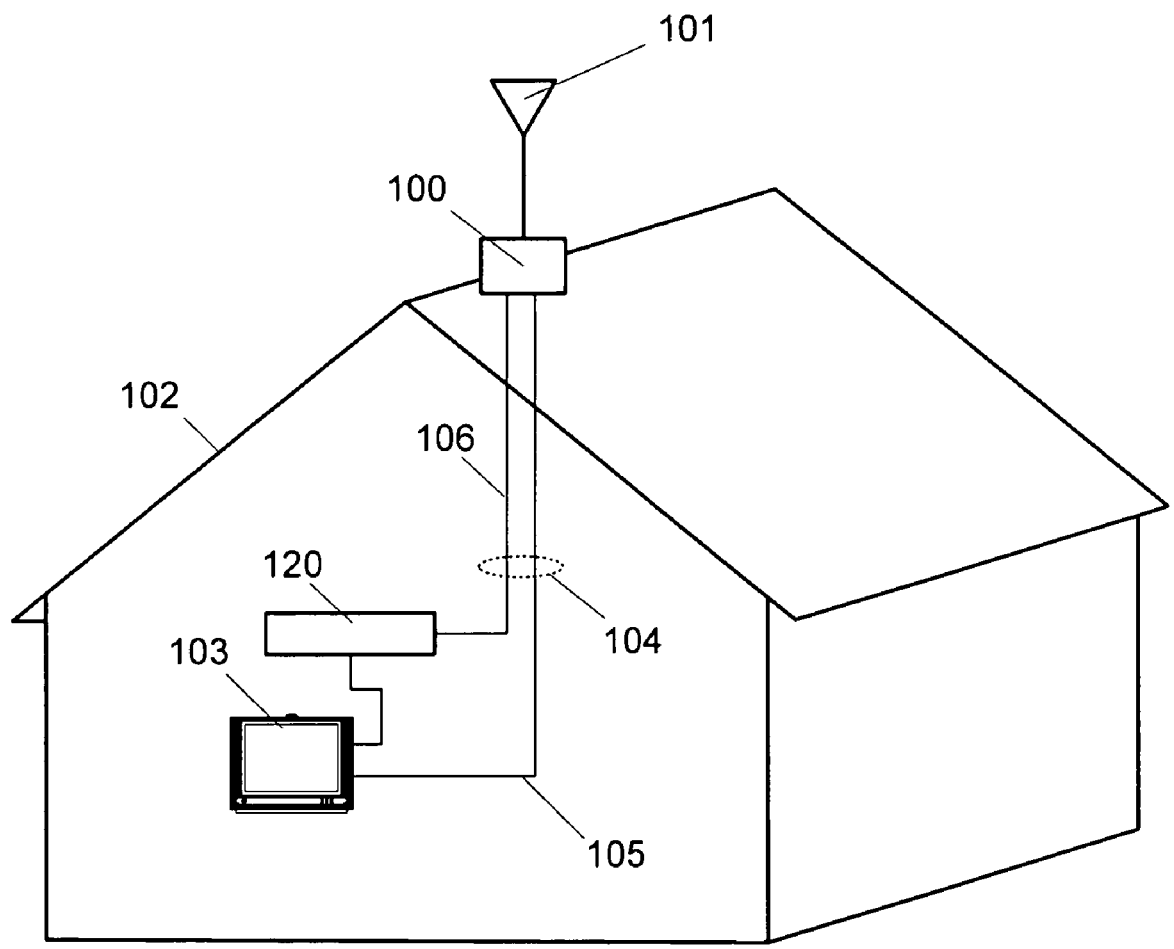
FIG. 2 illustrates another embodiment of an exterior antenna and amplifier system according to the principles described herein.

FIG. 2 illustrates another embodiment. As described above with reference to FIG. 1, the television set (103) may be have the capacity to determine and output a control signal for the amplifier circuit (100) based on the relative strength of the signal for the television channel to be received. However, many television sets, particularly older television sets, will not have been designed and built with this functionality. Consequently, the functions of determining and outputting a control signal for the amplifier circuit (100) based on the relative strength of the signal for the particular channel the television is tuned to receive can be performed by a separate control unit (120). The control unit (120) determines the channel being tuned by the television set (103), the relative strength of the signal for that channel and an appropriate control signal to adjust the gain of the amplifier circuit (100) accordingly.

Thus, in the embodiment of FIG. 2, the separate control unit (120) is connected to the control line (106) and provides a gain control signal and/or power for the amplifier circuit (100). The method of combining a gain control signal with the power for the amplifier circuit (100) will be described in more detail below. The control unit (120) may also control adjustments to the polarity and direction of the antenna (101) as will be described below.

Figure 3:
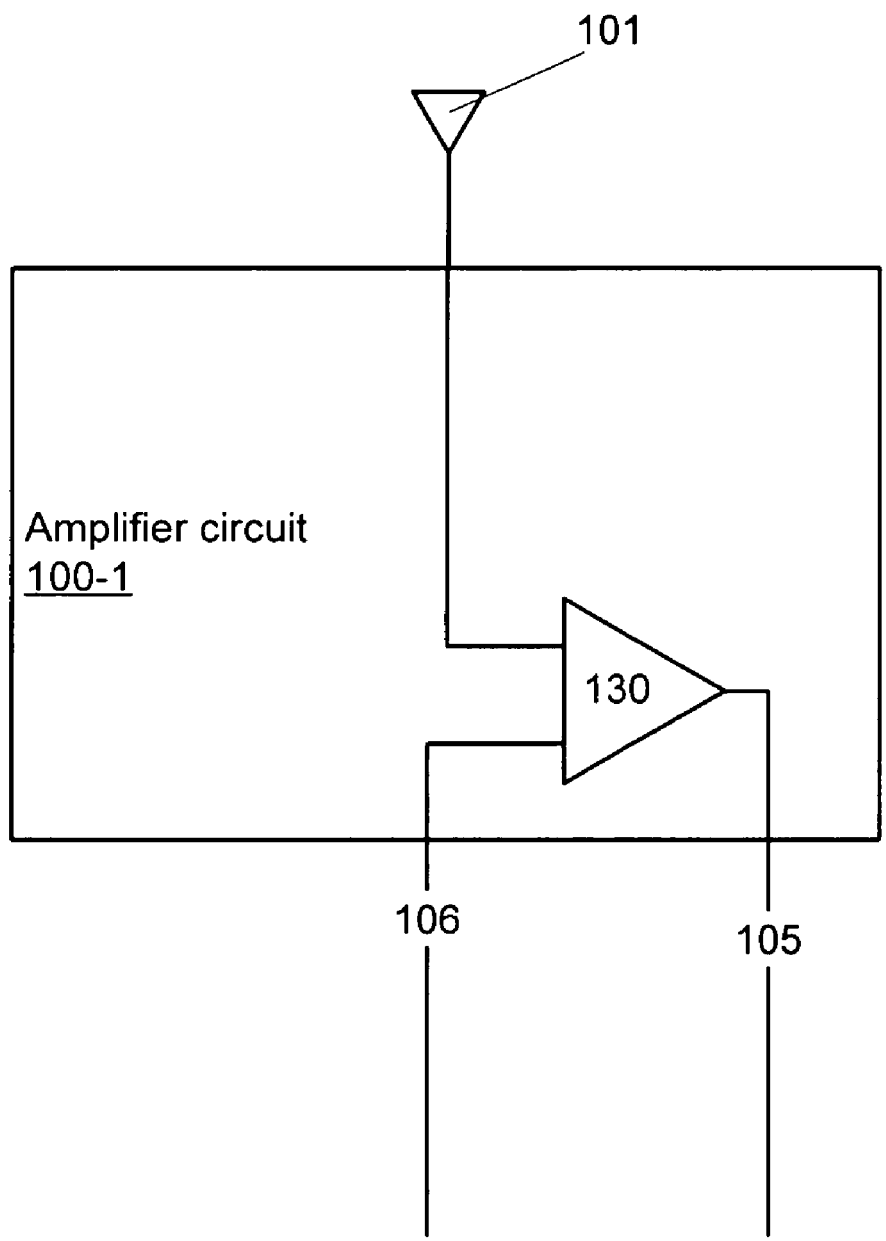
FIG. 3 is a more detailed illustration of an amplifier circuit that could be used in the systems described herein.

FIG. 3 is a more detailed illustration of an amplifier circuit that could be used in the systems of FIGS. 1 and 2 described above and other systems described herein. As shown in FIG. 3, the amplifier circuit (100-1) includes an amplifier (130) for which the gain can be selectively controlled by either the television set or separate control unit described above.

The antenna (101) outputs a signal to the amplifier (130). The signal from the antenna (101) is amplified according to the gain of the amplifier (130) and output on the signal cable (105) to the television or other receiving device inside the building.

The gain of the amplifier (130) is set by the control signal received on the control line (106), which is also connected to the amplifier (130). For example, the amplifier (130) may be a voltage controlled amplifier, the gain of which is determined by a voltage applied to the amplifier (130). In this way, both power for the amplifier (130) and control of the gain can be accomplished over control line (106).

For example, the amplifier (130) may only need a +5 volt DC power signal to operate. However, the amplifier (130) may be able to receive a higher voltage, for example, up to +18 volts. Consequently, a signal including +5 volts to operate the amplifier (130) plus an additional voltage indicative of the gain at which the amplifier (130) should operate can be supplied over control line (106) to both power the amplifier (130) and control the gain of the amplifier (130). For example, each increment of voltage, such as half a volt, over the voltage needed to power the amplifier, e.g., +5 volts, may indicate a corresponding increase in the gain of the amplifier (130). The voltage-controlled amplifier (130) is designed to accordingly adjust its gain based on the voltage applied over the control line (106).

Figure 4:
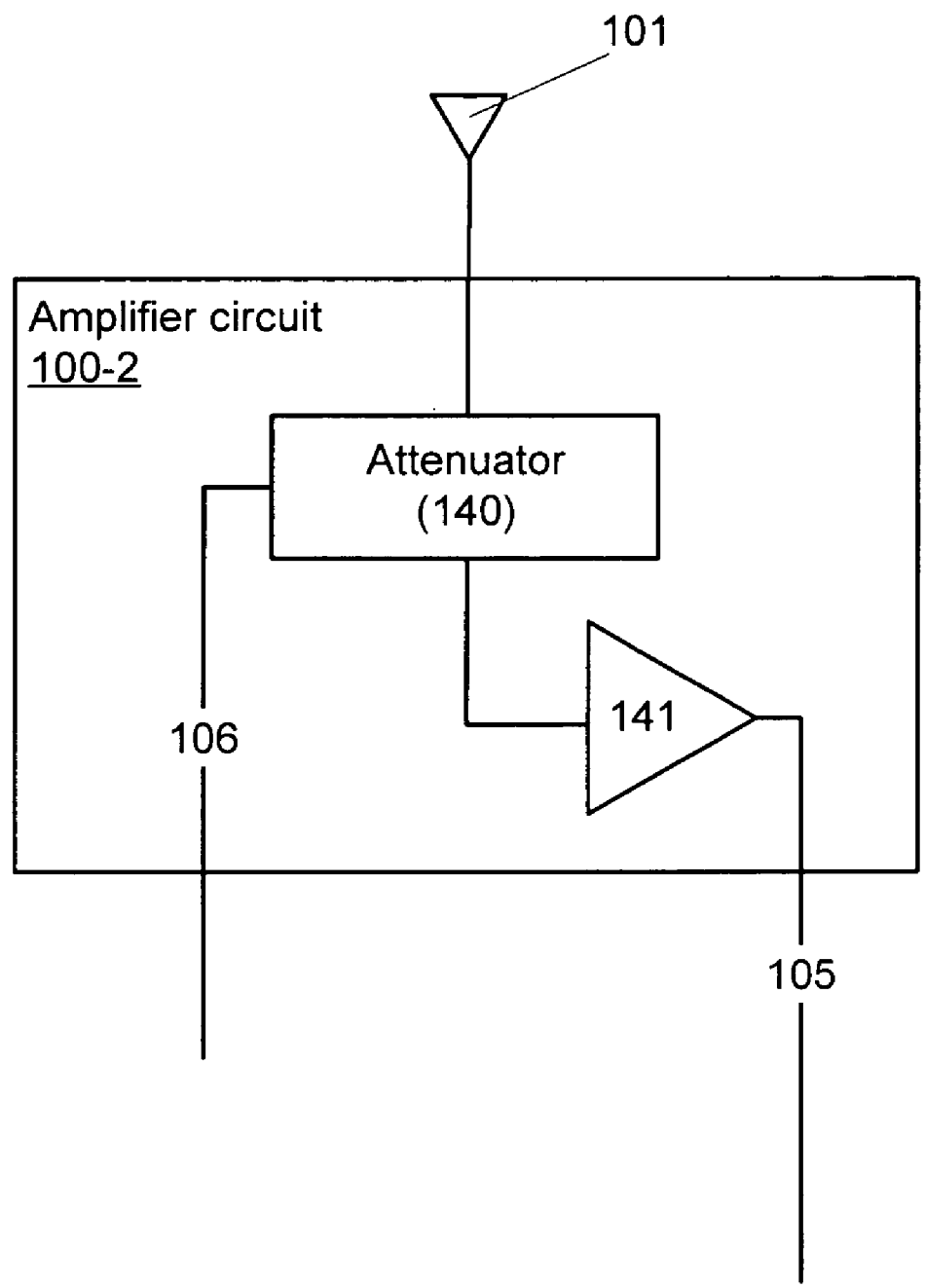
FIG. 4 illustrates a second embodiment for the amplifier circuit that could be used in the systems described herein.

FIG. 4 illustrates a second embodiment for the amplifier circuit (100-2) used in the systems described herein. As shown in FIG. 4, the antenna (101) outputs a signal to an amplifier (141). The signal from the antenna (101) is amplified according to the gain of the amplifier (141) and output on the signal cable (105) to the television or other receiving device inside the building. In the embodiment of FIG. 4, the gain of the amplifier circuit (100-2) is controlled directly, but is controlled by controlling an attenuator (140) that selectively attenuates the signal from the antenna (101).

For example, if the strength of the received signal from the antenna (101) is strong, the effective gain of the amplifier (141) is decreased due to the increased input signal. Similarly, if the signal strength from the antenna (101) is decreased, the effective gain of the amplifier (141) is increased.

As shown in FIG. 4, the attenuator (140) is controlled via the control line (106) which is also connected to a television (103, FIG. 1), other receiving device or a control unit (120, FIG. 2) as described above. The attenuator (140) may receive a logical control signal. Alternatively, the attenuator (140) may be voltage controlled and receive a variable DC voltage signal that both controls the attenuation (i.e., effective gain) and provides power for the amplifier circuit (100-2) in the same manner as described above. The attenuator (140) may be a diode attenuator, for example, a PIN diode attenuator.

Figure 5:
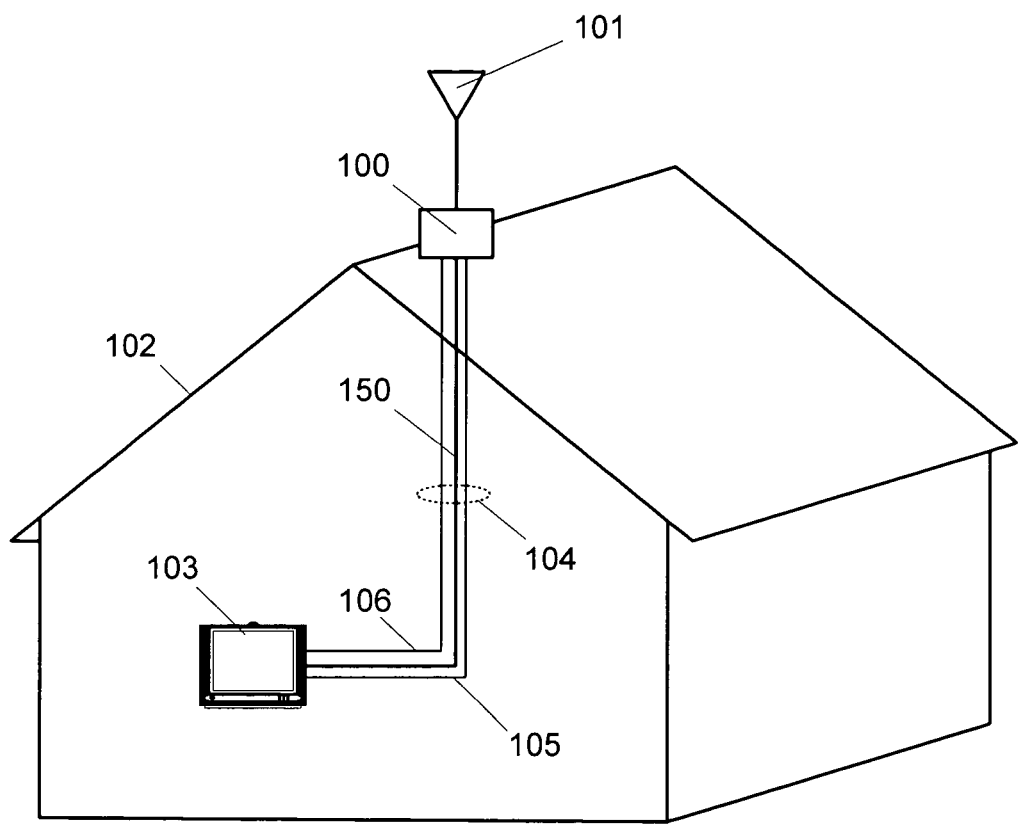
FIG. 5 illustrates another alternative embodiment of a system for selectively controlling an amplifier circuit for a television antenna.

FIG. 5 illustrates another alternative embodiment of a system of selectively controlling an amplifier circuit for a television antenna. As described above, the functions of powering the amplifier circuit and controlling the gain of the amplifier circuit can be advantageously combined in a single DC voltage signal of variable voltage. However, this is not necessarily so.

As shown in FIG. 5, the connection or cable (104) to the amplifier circuit (100) can contain three separate lines. These three lines are: (1) a signal line (105) bringing the antenna signal to the television (103) or other receiving device, (2) a power line (150) for powering the amplifier circuit (100) and (3) a control line (106) which sends a control signal to the amplifier circuit (100) to control the gain of the amplifier circuit (100), but does not also provide power for the amplifier circuit (100) as described above. In this embodiment, the amplifier or attenuator of the amplifier circuit (100) is controlled based on the control signal on line (106) and are not necessarily voltage-controlled. The control line (106) may also control the polarity and direction of the antenna (101) in a manner that will be described below.

Figure 6:
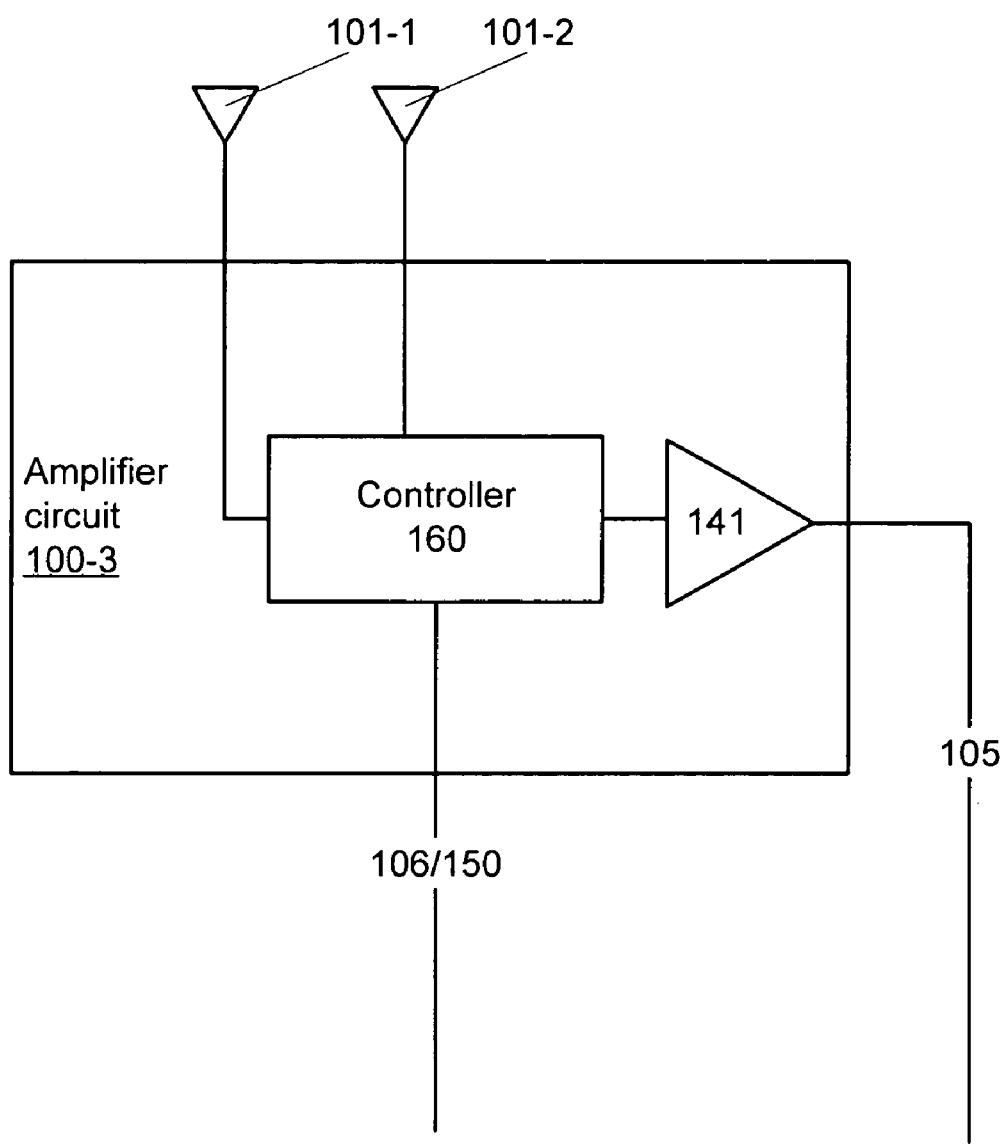
FIG. 6 illustrates another embodiment of an amplifier circuit for use in the systems described herein.

FIG. 6 illustrates another embodiment of an amplifier circuit for use in the systems described herein. As will be explained with reference to FIG. 6, the principles described herein can also be applied to selectively control the polarity of an exterior television antenna.

As shown in FIG. 6, the antenna may actually consist or two or more antennas (101-1, 101-2), or differently oriented elements of a single antenna structure. For example, there may be a horizontal element (101-1) and a vertical element (101-2) to the antenna. By controlling which antenna element (101-1, 101-2) is connected to the amplifier (141), the antenna can be given a different polarity, vertical or horizontal.

Consequently, the amplifier circuit (100-3) includes a controller (160). The controller (160) selectively interfaces the two antenna elements (101-1, 101-2) with the amplifier (141). Based on a control signal (106/150), the controller (160) will selectively provide the signal from the horizontal element (101-1) of the antenna or the signal from the vertical element (101-2) of the antenna to the amplifier (141). Thus, even though the antenna is fixed, its polarity can be changed by the controller (160).

Additionally, the controller (160) may selectively attenuate the signal from either the horizontal element (101-1) of the antenna or the signal from the vertical element (101-2) of the antenna, while providing both signals to the amplifier (141). In this way, the effective polarity of the antenna can be finely adjusted for optimal signal reception. As before, the amplifier (141) outputs a signal on line (105) to the television or other receiving device indoors.

For example, the following table provides an explanation of how the controller (160) operates depending on the DC voltage level of the control signal (106) received. Depending on the voltage level of the control signal, one of the antennas or antenna elements will be connected to the amplifier, as indicated by a check in the following table, and a particular effective gain will be implemented. The effective gain desired can be achieved by either controlling the gain of the amplifier (141) or selectively attenuating the signals from the two antenna elements.

TABLE 1

| Voltage | Effective Gain | Antenna 1 (101-1) | Antenna 2 (101-2) |
|---------|----------------|-------------------|-------------------|
| 5.0 V   | 0              | ✓                 |                   |
| 5.5 V   | −6             | ✓                 |                   |
| 6.0 V   | −10            | ✓                 |                   |
| 6.5 V   | −20            | ✓                 |                   |
| 7.0 V   | 0              |                   | ✓                 |
| 7.5 V   | −6             |                   | ✓                 |
| 8.0 V   | −10            |                   | ✓                 |
| 8.5 V   | −20            |                   | ✓                 |

Figure 7:
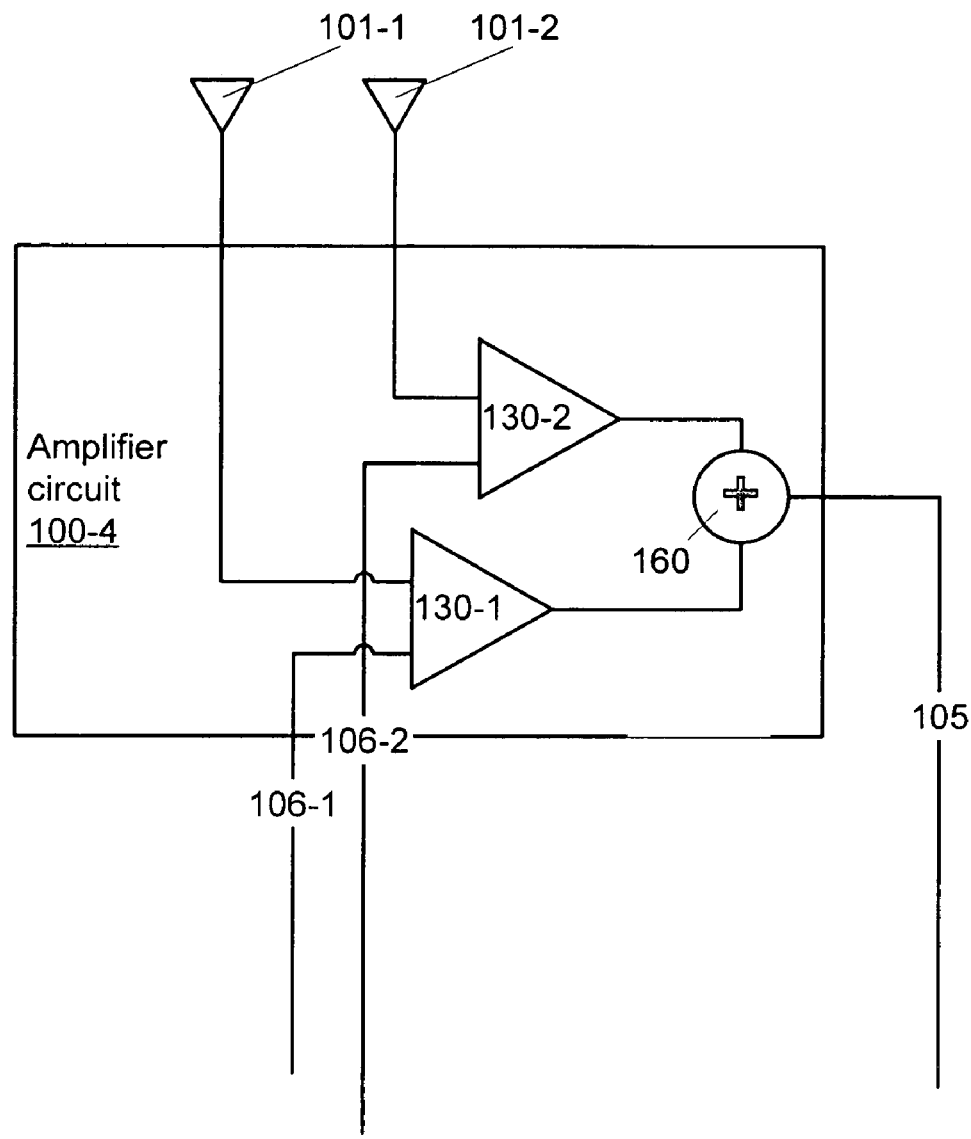
FIG. 7 illustrates still another embodiment of an amplifier circuit for use in the systems described herein.

FIG. 7 illustrates still another embodiment of an amplifier circuit (100-4) for use in the systems described above. Similar to the embodiment of FIG. 6, FIG. 7 shows that the antenna may actually consist or two or more antennas (101-1, 101-2), or differently oriented elements of a single antenna structure. For example, there may be a horizontal element (101-1) and a vertical element (101-2) to the antenna.

As shown in FIG. 7, a separate amplifier (130-1, 130-2) receives the signal from each of the antenna elements (101-1, 101-2). Each amplifier (130-1, 130-2) receives a separate control signal (106-1, 106-2) that controls the gain of that amplifier. As describe above, the control signals (106-1, 106-2) may be DC voltage signals that both provide power to and control the gain of a respective amplifier (130-1, 130-2). The output of the two amplifiers (130-1, 130-2) is then combined in a combiner (160) and output on line (105) to a television or other receiving device indoors.

By controlling the respective gain of the amplifiers for the horizontal element (101-1) of the antenna and the vertical element (101-2) of the antenna, the effective polarity of the antenna can be adjusted as desired. Thus, the control signals (106-1, 106-2) will set the gains of the respective antenna elements (101-1, 101-2) based on the polarity needed for optimal broadcast signal reception.

Figure 8:
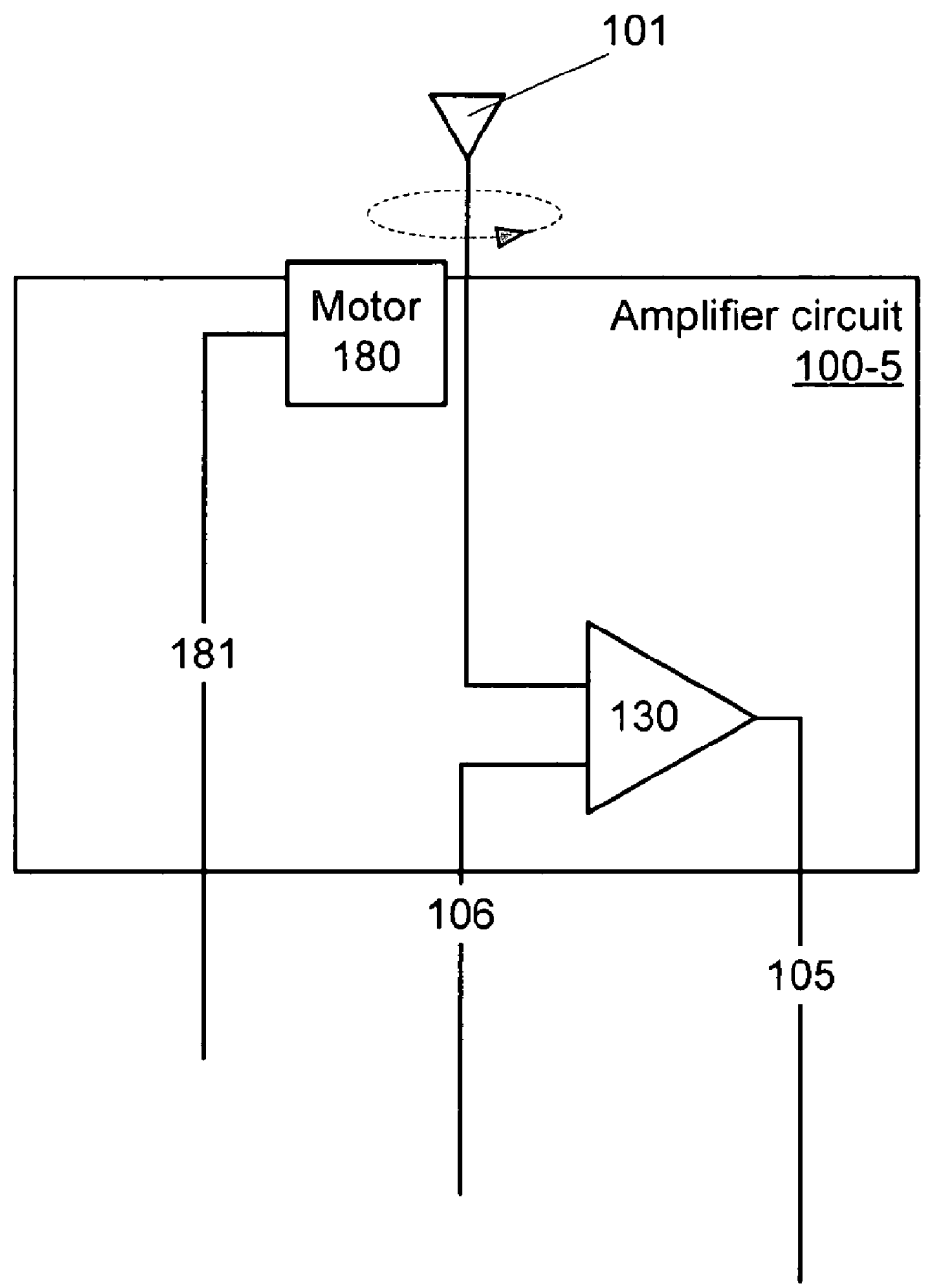
FIG. 8 illustrates still another embodiment of an amplifier circuit for use in the systems described herein.

FIG. 8 illustrates still another embodiment of an amplifier circuit according to the principles described herein. As shown in FIG. 8, the amplifier circuit (100-5) includes an amplifier (130) for which the gain can be selectively controlled. The antenna (101) outputs a signal to the amplifier (130). The signal from the antenna (101) is amplified according to the gain of the amplifier (130) and output on the signal cable (105) to the television or other receiving device inside the building.

The gain of the amplifier (130) is set by the control signal received on the control line (106), which is also connected to the amplifier (130). For example, the amplifier (130) may be a voltage controlled amplifier, the gain of which is determined by a voltage applied to the amplifier. In this way, both power for the amplifier (130) and control of the gain can be provided over the control line (106), as described above.

Additionally, a motor (180) may be used to rotate the antenna (101) for optimal reception. The motor (180) is controlled through a motor control line (181). In this way, the antenna (101) can be rotated for optimal reception. Rotation may be either clockwise or counterclockwise.

Figure 9:
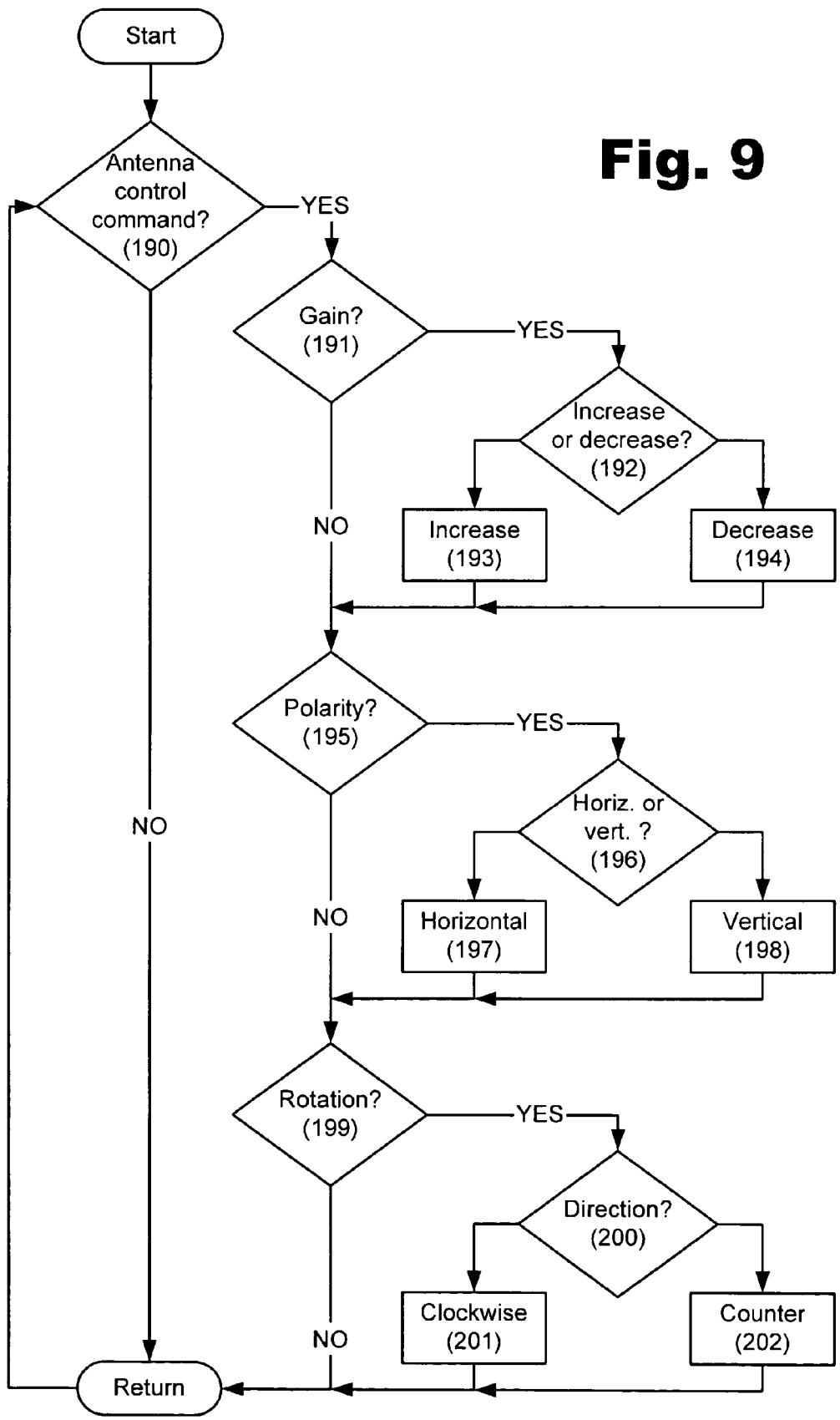
FIG. 9 is a flow chart illustrating the operation of a system according to the principles described herein.

FIG. 9 is a flow chart illustrating the operation of a system according to the principles described herein. As illustrated in FIG. 9, elements of the various systems described above can be combined to result in an antenna system in which gain, polarity and rotational position are all controlled to result in optimal signal reception. The method illustrated in FIG. 9 can be implemented in software, firmware or hardware in the television (103, FIG. 1) or the control unit (120, FIG. 2) described above to provide the various control signals mentioned in the systems described above.

As shown in FIG. 9, the flow begins by determining whether an antenna control command is needed (determination 190). This may occur when the television is turned on, when a new channel is tuned that necessitates adjustment of the antenna or anytime the signal being received is detected as being less that optimal. If an antenna control command is needed because reception is less than optimal, the system considers whether to adjust gain (determination 191), antenna polarity (determination 195) and angular position or rotation of the antenna (determination 199).

If the gain needs to be adjusted (determination 191), it is then determined, based on signal strength, whether the gain needs to be increased or decreased (determination 192). Accordingly, a control signal is issued as described above to increase (step 193) or decrease (step 194) the gain of the amplifier circuit. As described above, this gain control signal may be a variable level, DC voltage signal that also powers the amplifier circuit. Alternatively, the gain control circuit may be an electronic logic signal or other signal. The control signal may be sent to an amplifier, an attenuator or a controller in the amplifier circuit depending on the system.

Next, it is determined whether the polarity of the antenna needs to be adjusted (determination 195). If the polarity needs to be adjusted, it is next determined if the adjustment should make the polarity more horizontal or more vertical (determination 196). Accordingly, the polarity of the antenna is adjusted, as described above, to be more horizontal (step 197) or more vertical (step 198).

Finally, it is determined whether the angular position of the antenna needs to be adjusted (determination 199). If the angular position needs to adjusted, it is next determined if the adjustment should be clockwise or counterclockwise (determination 200). Accordingly, a control signal is sent to a motor driving the antenna. The antenna is then rotated clockwise (step 201) or counterclockwise (step 202) as needed for optimal reception.

With these various parameters being reviewed and adjusted, the antenna can be optimized to receive the desired broadcast television signal. This includes accounting for signal strength, direction and polarity. The system described can adjust for the various polarizations, including circular or elliptical, that might by used.

The preceding description has been presented only to illustrate and describe embodiments of the invention. It is not intended to be exhaustive or to limit the invention to any precise form disclosed. Many modifications and variations are possible in light of the above teaching. It is intended that the scope of the invention be defined by the following claims.

What is claimed is:

1. A system for controlling an exterior television antenna comprising:
- an amplifier circuit mounted on a building exterior with said exterior television antenna and connected to said television antenna;
- a control line extending into an interior of said building, said control line being connected to said amplifier circuit for controlling a gain of said amplifier circuit,
- wherein said control line also provides power for said amplifier circuit wherein said control line carries a control signal which is a direct current (DC) voltage signal comprising a voltage to power said amplifier circuit plus an additional voltage that varies to indicate a desired gain of said amplifier circuit.

2. A system for controlling an exterior television antenna comprising:
- an amplifier circuit mounted on a building exterior with said exterior television antenna and connected to said television antenna;
- a control line extending into an interior of said building, said control line being connected to said amplifier circuit for controlling a gain of said amplifier circuit wherein said amplifier circuit comprises a voltage controlled amplifier, wherein said amplifier receives power and a voltage controlling a gain of said amplifier over said control line.

3. The system of claim 1, wherein said amplifier circuit comprises:
- an attenuator connected to and controlled by said control line; and
- an amplifier,
- wherein said attenuator selectively attenuates a signal from said antenna before providing that signal to said amplifier.

4. The system of claim 3, wherein said attenuator is voltage controlled.

5. The system of claim 4, wherein said control line also provides power for said amplifier circuit.

6. A system for controlling an exterior television antenna comprising:
- an amplifier circuit mounted on a building exterior with said exterior television antenna and connected to said television antenna;
- a control line extending into an interior of said building, said control line being connected to said amplifier circuit for controlling a gain of said amplifier circuit wherein:
- said exterior television antenna comprises two or more antenna elements differently oriented;
- said amplifier circuit further comprises two or more amplifiers connected to respective antenna elements; and
- said control line provides independent control signals to said amplifiers to selectively adjust a gain of each of said amplifiers to adjust a polarity of said antenna.

7. The system of claim 6, wherein said amplifier circuit further comprises a summer for combining signals from said two or more amplifiers.

* * * * *